United States Patent
Ambo et al.

(10) Patent No.: US 9,863,992 B2
(45) Date of Patent: Jan. 9, 2018

(54) FAULT DETECTING APPARATUS AND DETECTING METHOD OF THE SAME

(71) Applicant: TOSHIBA MITSUBISHI-ELECTRIC INDUSTRIAL SYSTEMS CORPORATION, Chuo-ku (JP)

(72) Inventors: Tatsuaki Ambo, Tokyo (JP); Eiichi Ikawa, Tokyo (JP); Chieko Umeno, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 523 days.

(21) Appl. No.: 14/314,069

(22) Filed: Jun. 25, 2014

(65) Prior Publication Data

US 2014/0306713 A1  Oct. 16, 2014

Related U.S. Application Data

(63) Continuation of application No. PCT/JP2011/080072, filed on Nov. 26, 2011.

(51) Int. Cl.
*G01R 31/02* (2006.01)
*H01L 31/02* (2006.01)
*H02S 50/10* (2014.01)

(52) U.S. Cl.
CPC ......... *G01R 31/024* (2013.01); *G01R 31/025* (2013.01); *H01L 31/02021* (2013.01); *H02S 50/10* (2014.12); *Y02E 10/50* (2013.01)

(58) Field of Classification Search
CPC ..... G01R 31/024; G01R 31/025; H02S 50/10; H01L 31/02021; Y02E 10/50
See application file for complete search history.

(56) References Cited

U.S. PATENT DOCUMENTS

| | | | |
|---|---|---|---|
| 6,420,852 | B1 | 7/2002 | Sato |
| 2010/0071742 | A1 | 3/2010 | de Rooij et al. |
| 2011/0172842 | A1* | 7/2011 | Makhota ........... H01L 31/02021 |
| | | | 700/292 |
| 2012/0049879 | A1* | 3/2012 | Crites ................ H02S 50/10 |
| | | | 324/761.01 |

FOREIGN PATENT DOCUMENTS

| | | |
|---|---|---|
| CN | 101718832 A | 6/2010 |
| JP | 58-206976 A | 12/1983 |

(Continued)

OTHER PUBLICATIONS

Extended European Search Report dated Jun. 10, 2015 in Patent Application No. 11878581.5.

(Continued)

*Primary Examiner* — David M Gray
*Assistant Examiner* — Michael Harrison
(74) *Attorney, Agent, or Firm* — Oblon, McClelland, Maier & Neustadt, L.L.P.

(57) ABSTRACT

There is provided a fault detecting apparatus for detecting a fault in an electric circuit including connecting circuits and an aggregating circuit. The fault detecting apparatus includes a fault detector that detects a fault when at least one of connecting circuit current detectors detects that a current flows and an aggregating current detector detects that a current does not flow.

3 Claims, 2 Drawing Sheets

(56) References Cited

FOREIGN PATENT DOCUMENTS

| | | |
|---|---|---|
| JP | 2000-133318 A | 5/2000 |
| JP | 2005-168156 A | 6/2005 |
| JP | 2010-197172 A | 9/2010 |
| JP | 2011-71346 A | 4/2011 |
| JP | 2011-187807 A | 9/2011 |
| WO | WO 2011/111260 A1 | 9/2011 |

OTHER PUBLICATIONS

International Preliminary Report on Patentability dated Jul. 10, 2014 in PCT/JP2011/080072 filed on Dec. 26, 2011(English translation only).
Written Opinion dated Apr. 3, 2012 in PCT/JP2011/080072 filed on Dec. 26, 2011(English translation only).
International Search Report dated Apr. 3, 2012 for PCT/JP2011/080072 Filed on Dec. 26, 2011 (with English Translation).
International Written Opinion dated on Apr. 3, 2012 for PCT/JP2011/080072 Filed on Dec. 26, 2011.
Combined Office Action and Search Report dated Jun. 12, 2015 in Chinese Patent Application No. 201180073813.8 with English translation.

* cited by examiner

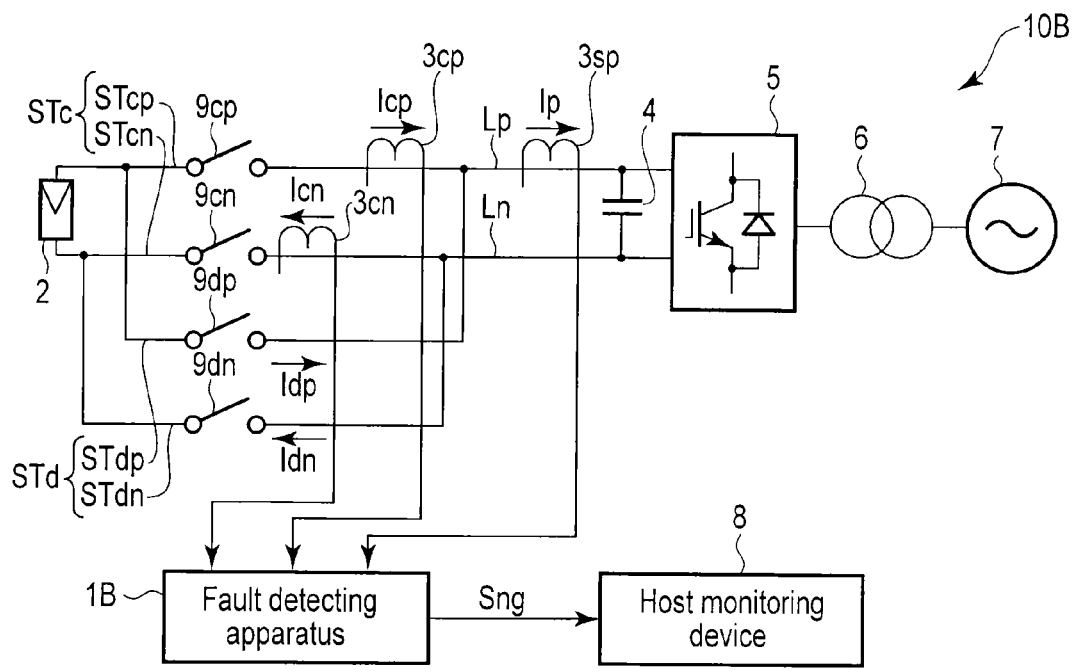
F I G. 3
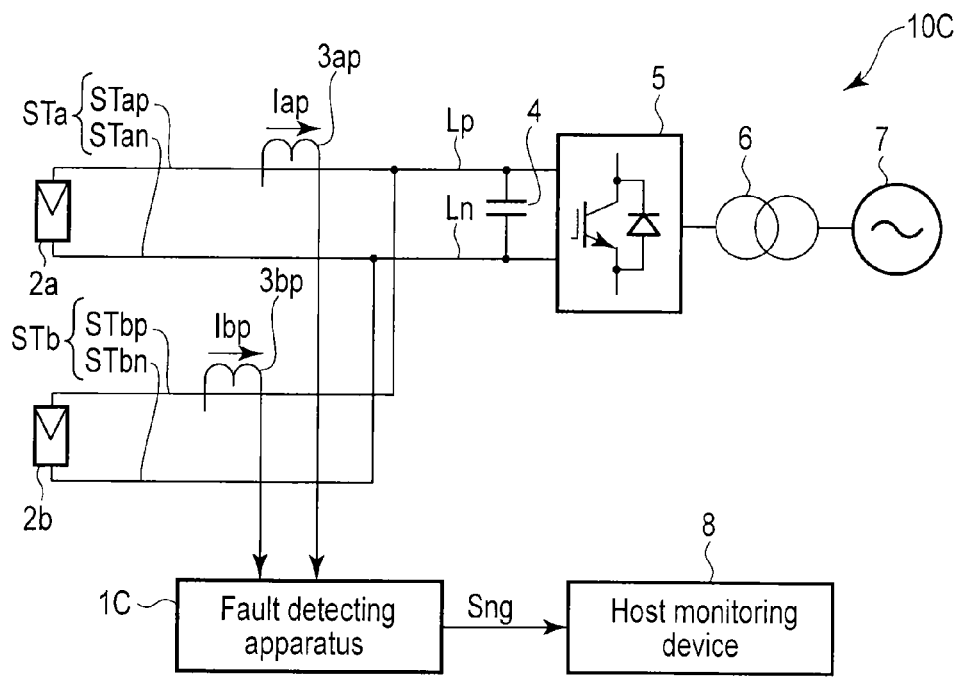
F I G. 4

FAULT DETECTING APPARATUS AND DETECTING METHOD OF THE SAME

CROSS REFERENCE TO RELATED APPLICATIONS

This application is a Continuation Application of PCT Application No. PCT/JP2011/080072, filed Dec. 26, 2011, the entire contents of which are incorporated herein by reference.

BACKGROUND OF THE INVENTION

1. Field of the Invention

Embodiments described herein relate generally to a fault detecting apparatus for detecting a fault based on a current.

2. Description of the Related Art

In general, connecting a plurality of cells parallel to obtain a large capacity of power has been known. In a large-scale photovoltaic system, for example, a number of strings connected to PV (photovoltaic) arrays are connected parallel. In addition, monitoring a current flowing through the strings to detect faults at the PV arrays has been known.

On the other hand, detecting a ground fault or short circuit by detecting a current in an electric circuit has been known (see, for example, Patent Literature 1).

To detect faults at all the PV arrays, however, current sensors need to be provided at positive and negative sides of all the strings. If the current sensors are thus provided, the number of current sensors is increased in the large-scale photovoltaic system. If the number of current sensors is increased, devices (for example, A/D (analog/digital) converter for signal processing) and wiring lines accompanying the current sensors are also increased. Such a fault detecting apparatus therefore causes increase in costs of the entire system.

CITATION LIST

Patent Literature

Patent Literature 1
Jpn. Pat. Appln. KOKAI Publication No. 2010-197172

BRIEF SUMMARY OF THE INVENTION

An object of embodiments is to provide a fault detecting apparatus capable of reducing the number of current sensors configured to detect a fault.

In accordance with an aspect of embodiments, there is provided a fault detecting apparatus for detecting a fault in an electric circuit comprising a plurality of connecting circuits and an aggregating circuit, the plurality of connecting circuits comprising positive electrode wires and negative electrode wires connected parallel to respectively connect a plurality of DC power supplies with an inverter, and the aggregating circuit being configured to aggregate the plurality of connecting circuits and to connect the aggregated connecting circuits with the inverter. The fault detecting apparatus comprises a plurality of connecting circuit current detectors configured to detect currents flowing through the positive electrode wires or the negative electrode wires of all the connecting circuits except one connecting circuit, respectively; an aggregating current detector configured to detect a current flowing through the aggregating circuit; and a fault detector configured to detect a fault when at least one of the connecting circuit current detectors detects that a current flows and the aggregating current detector detects that a current does not flow.

BRIEF DESCRIPTION OF THE SEVERAL VIEWS OF THE DRAWING

FIG. 3 is a diagram showing a configuration of a photovoltaic system to which a fault detecting apparatus of Third Embodiment is applied; and FIG. 4 is a diagram showing a configuration of a photovoltaic system to which a fault detecting apparatus of Fourth Embodiment is applied.

DETAILED DESCRIPTION OF THE INVENTION

Embodiments will be hereinafter described with reference to the accompanying drawings.

First Embodiment

Figure 1:
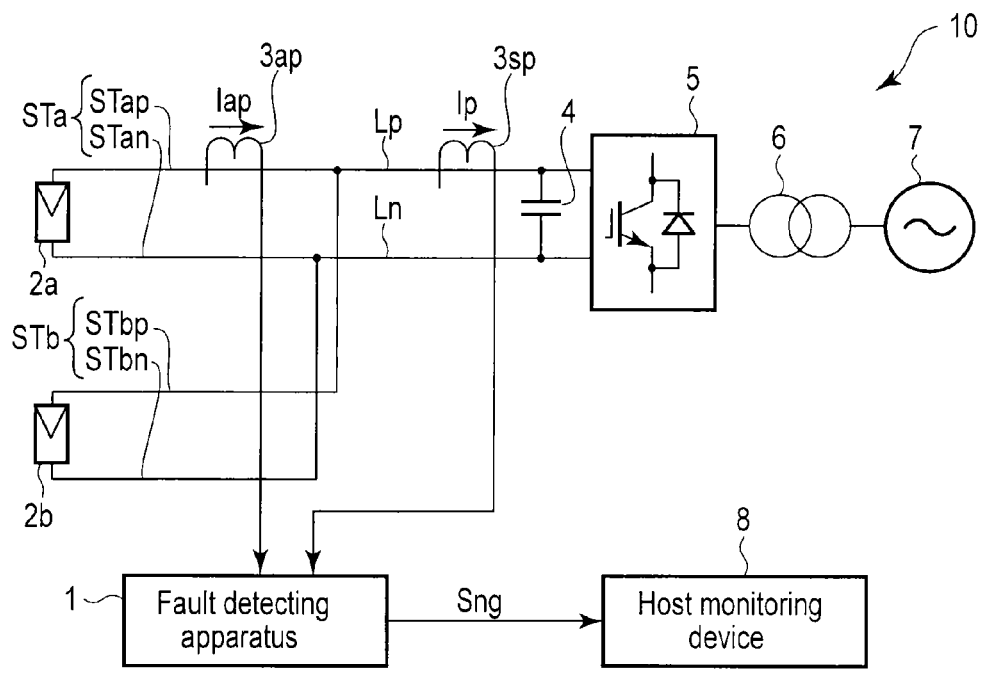
FIG. 1 is a diagram showing a configuration of a photovoltaic system to which a fault detecting apparatus of First Embodiment is applied.

FIG. 1 is a diagram showing a configuration of a photovoltaic system 10 to which a fault detecting apparatus 1 of First Embodiment is applied. Like or similar elements in the figure are denoted by similar reference numbers and their detailed descriptions are omitted, and different elements are mainly described. Duplicated descriptions are similarly omitted in the following embodiments, too.

The photovoltaic system 10 in which two PV arrays 2a and 2b and two strings STa and STb are connected parallel is mainly described, but any number that is equal to or greater than two, of PV arrays and strings may be provided.

The photovoltaic system 10 includes the fault detecting apparatus 1, two PV arrays 2a and 2b, two current sensors 3ap and 3sp, a smoothing capacitor 4, an inverter 5, and an interconnection transformer 6. The photovoltaic system 10 is connected to a power system 7.

The strings STa and STb are circuits which connects the inverter 5 and the PV arrays 2a and 2b, respectively. The strings STa and STb include positive electrode wires STap and STbp and negative electrode wires STan and STbn, respectively. The positive electrode wires STap and STbp and the negative electrode wires STan and STbn, of the strings STa and STb, are connected to the PV arrays 2a and 2b, respectively. All the strings STa and STb are connected to a circuit including a set of wires Lp and Ln aggregated by parallel connection. The aggregated wires Lp and Ln are connected to a direct-current side of the inverter 5.

Two PV arrays 2a and 2b are connected parallel to the direct-current side of the inverter 5. The PV arrays 2a and 2b are cells configured to generate power by light such as solar light. The PV arrays 2a and 2b supply the generated power to the inverter 5.

The smoothing capacitor 4 is provided at the direct-current side of the inverter 5. The smoothing capacitor 4 smoothes DC voltages supplied from the PV arrays 2a and 2b.

The inverter 5 converts the DC power supplied from the PV arrays 2a and 2b to an AC power synchronized with the power system 7. The inverter 5 supplies the converted AC power to the power system 7 via the interconnection transformer 6. The power system 7 is, for example, a commercial system. The inverter 5 may convert the DC power to a single-phase AC power or a three-phase AC power.

The current sensor 3$ap$ is provided to detect current Iap flowing through the positive electrode wire STap of the string STa. The current sensor 3$ap$ outputs the detected current Iap to the fault detecting apparatus 1.

The current sensor 3$sp$ is provided to detect current Ip flowing through the aggregated positive electrode wire Lp. The current sensor 3$sp$ outputs the detected current Ip to the fault detecting apparatus 1. The current sensor 3$sp$ may serve as a current sensor provided at the direct-current side of the inverter 5 to enhance control accuracy.

In the fault detecting apparatus 1, the current sensor 3$ap$ is provided for two strings STa and STb to detect a fault. If the strings are n-parallel (where n is a natural number equal to or greater than 2), the current sensors are provided at positive electrodes or negative electrodes of all n−1 strings except one string. The number of the current sensors provided at the strings is therefore n−1. If the current sensor 3$sp$ provided at the aggregated positive electrode wire Lp is added to these current sensors, the number of the current sensors employed in the fault detecting apparatus 1 is n.

The fault detecting apparatus 1 detects the fault at each of the strings STa and STb, based on the currents Iap and Ip detected by two current sensors 3$ap$ and 3$sp$. When the fault detecting apparatus 1 detects the fault, the fault detecting apparatus 1 outputs a fault detection signal Sng to notify occurrence of the fault to a host monitoring device 8.

Next, a method of detecting the fault by the fault detecting apparatus 1 will be described.

If the fault detecting apparatus 1 detects the current Iap flowing through the positive electrode wire STap of the string STa and detects the current Ip not flowing through the aggregated positive electrode wire Lp, the fault detecting apparatus 1 determines that a fault current flows (i.e., a fault occurs). At this time, the direction of the detected current Iap is not considered.

When the strings are n-parallel, if the current is detected at at least one string, of all the strings at which the current sensors are provided and if the current Ip flowing through the aggregated positive electrode wire Lp is not detected, the fault current is determined to flow.

Next, a principle of detecting the fault will be described. The direction of the current flowing when all the PV arrays 2$a$ and 2$b$ normally generate the power is defined as a forward direction. In other words, the direction in which the currents Iap and Ip flowing through the positive electrode wires Lp, STap and STbp are input from the PV arrays 2$a$ and 2$b$ to the inverter 5, is the forward direction. The direction in which the currents flowing through the negative electrode wires Ln, STan and STbn are output from the inverter 5 to the PV arrays 2$a$ and 2$b$, is the forward direction. The forward direction will also be hereinafter considered in this manner.

First, it will be considered that the PV array 2$b$ short-circuits at night and that the PV array 2$a$ normally starts generating the power in the daytime.

In this case, the current output from the PV array 2$a$ flows to the PV array 2$b$. In other words, since a circulating circuit flows between two strings STa and STb, no current flows in the aggregated wires Lp and Ln. At this time, the current Iap flows in the forward direction, in the positive electrode wire STap of the string STa and the current Ibp flows in the opposite direction, in the positive electrode wire STbp of the string STb.

Next, it will be considered that the PV array 2$a$ short-circuits at night and that the PV array 2$b$ normally starts generating the power in the daytime.

In this case, the current output from the PV array 2$b$ flows to the PV array 2$a$. In other words, since a circulating circuit flows between two strings STa and STb, no current flows in the aggregated wires Lp and Ln. At this time, the current Iap flows in the opposite direction, in the positive electrode wire STap of the string STa and the current Ibp flows in the forward direction, in the positive electrode wire STbp of the string STb.

Thus, if the current Iap is detected by the current sensor 3$ap$ provided at the string STa, irrespective of the direction, and if the current Ip is not detected by the current sensor 3$sp$ provided at the aggregated wire Lp, the fault current can be determined to flow.

According to the present embodiment, a fault that the PV arrays 2$a$ and 2$b$ short-circuit at night, etc., which does not cause an overcurrent to flow, can be detected based on the current Iap detected by the current sensor 3$ap$ provided at each of all the n−1 strings except one string and the current Ip detected by the current sensor 3$sp$ provided at the aggregated wire Lp.

The configuration of providing all the current sensors 3$ap$ and 3$sp$ on the positive electrode wires Lp and STap has been described, but the current sensors 3$ap$ and 3$sp$ may be provided on the negative electrode wires Ln and STan. In other words, a fault can be detected if the current sensor is provided at each of all the n−1 strings except one string and if the single current sensor is provided for the aggregated wires Lp and Ln. Therefore, the number of the provided current sensors is n, for the n-parallel strings.

In addition, by employing current sensor 3$sp$ provided on the aggregated wire Lp as the current sensor to be used for the control of the inverter 5, the number of the current sensors can be further reduced.

Furthermore, by reducing the number of the current sensors 3$ap$ and 3$sp$ to detect a fault, the devices (for example, A/D converter) and wiring lines accompanying the current sensors can also be reduced.

Second Embodiment

Figure 2:
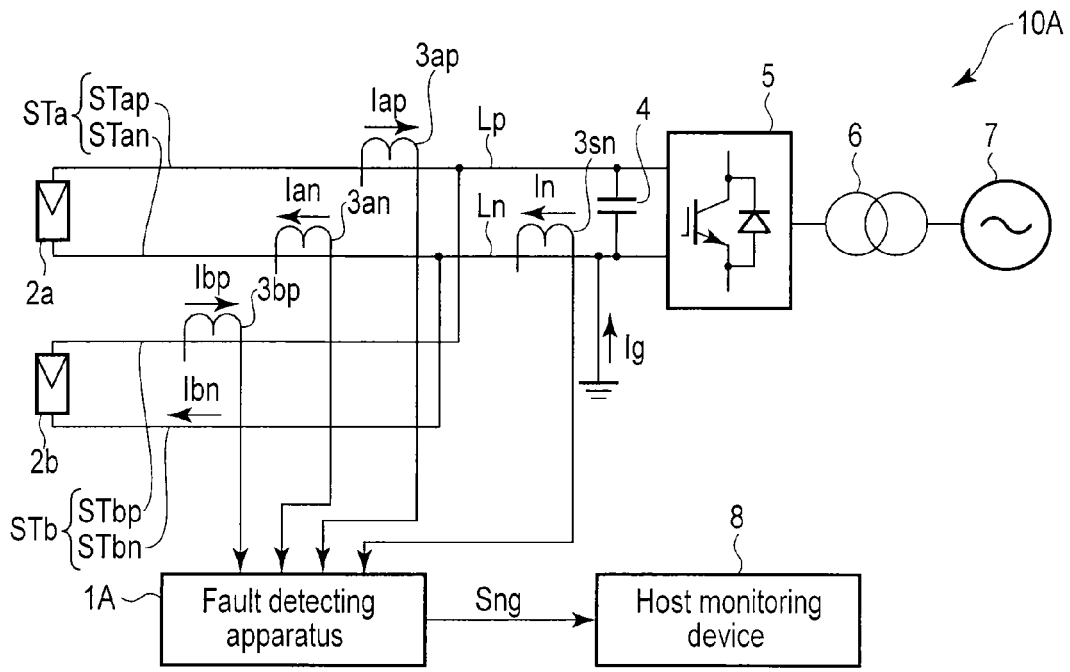
FIG. 2 is a diagram showing a configuration of a photovoltaic system to which a fault detecting apparatus of Second Embodiment is applied.

FIG. 2 is a diagram showing a configuration of a photovoltaic system 10A to which a fault detecting apparatus 1A of Second Embodiment is applied.

The photovoltaic system 10A in which two PV arrays 2$a$ and 2$b$ and two strings STa and STb are connected parallel will be mainly described, but any number that is equal to or greater than two, of PV arrays and strings may be provided.

In the photovoltaic system 10A, an aggregated negative electrode wire Ln in the photovoltaic system 10 of the First Embodiment shown in FIG. 1 is grounded, the current sensor 3$sp$ in the photovoltaic system 10 is replaced with a current sensor 3$sn$, two current sensors 3$an$ and 3$bp$ are added, and the fault detecting apparatus 1 in the photovoltaic system 10 is replaced with the fault detecting apparatus 1A. The other portions are the same as those of the First Embodiment.

The current sensor 3$an$ is provided to detect current Ian flowing through a negative electrode wire STan of the string STa. The current sensor 3$an$ outputs the detected current Ian to the fault detecting apparatus 1A. The current sensor 3$bp$ is provided to detect current Ibp flowing through a positive electrode wire STbp of the string STb. The current sensor 3$bp$ outputs the detected current Ibp to the fault detecting apparatus 1A.

The current sensor 3*sn* is provided to detect current In flowing through the aggregated negative electrode wire Ln. The current sensor 3*sn* is provided at a negative electrode which is a ground electrode. The current sensor 3*sn* outputs the detected current In to the fault detecting apparatus 1A. The current sensor 3*sn* may serve as a current sensor provided at a direct-current side of an inverter 5 to enhance the control accuracy.

In the fault detecting apparatus 1A, three current sensors 3*ap*, 3*an* and 3*bp* are provided for two strings STa and STb to detect a fault. If the strings are n-parallel, the current sensors are provided at positive electrodes and negative electrodes of all n−1 strings except one string, and the current sensor is provided at the positive electrode or the negative electrode of the excluded string. The number of the current sensors provided at the strings is thus 2n−1. If the current sensor 3*sn* provided on the aggregated negative electrode (ground electrode) wire Ln is added to the current sensors, the number of the current sensors used in the fault detecting apparatus 1A is 2n.

The fault detecting apparatus 1A detects a fault at each of the strings STa and STb, based on the currents Iap, Ian, Ibp and In detected by four current sensors 3*ap*, 3*an*, 3*bp* and 3*sn*. If the fault detecting apparatus 1A detects the fault, the fault detecting apparatus 1A outputs a fault detection signal Sng to notify occurrence of the fault to a host monitoring device 8.

Next, a method of detecting the fault by the fault detecting apparatus 1A will be described.

The fault detecting apparatus 1A computes a ground fault current Ig by the following equation, based on the currents Iap and Ibp flowing at the positive electrode sides of the respective strings STa and STb, and the current In flowing through the aggregated negative electrode wire Ln.

$$Ig=Iap+Ibp-In \quad (1)$$

If the fault detecting apparatus 1A determines that the computed ground fault current Ig is not zero (for example, the ground fault current Ig is equal to or greater than a preset current value), the fault detecting apparatus 1A determines that the ground fault has occurred.

If the strings are n-parallel, the ground fault current Ig is computed by subtracting the current flowing through the aggregated wire from a sum of the currents flowing through the positive electrode wires (or negative electrode wires) of the respective strings.

If the fault detecting apparatus 1A determines that the ground fault has occurred, the fault detecting apparatus 1A executes computation to specify the string STa or STb at which the ground fault has occurred. More specifically, the fault detecting apparatus 1A compares the currents Iap and Ibp flowing at the positive electrode sides with the currents Ian and Ibn flowing at the negative electrode sides, in the respective strings STa and STb. The fault detecting apparatus 1A computes the current Ibn flowing at the negative electrode side of the string STb at which no current sensor is provided, in the following equation.

$$Ibn=In-Ian \quad (2)$$

When the fault detecting apparatus 1A determines whether the ground fault occurs at the string STa or not, the fault detecting apparatus 1A computes a difference between the current Iap flowing at the positive electrode side and the current Ian flowing at the negative electrode side. If the fault detecting apparatus 1A discriminates that the computed difference is not zero (for example, the difference is equal to or greater than a preset current value), the fault detecting apparatus 1A determines that the ground fault has occurred at the string STa. Similarly to this, the fault detecting apparatus 1A also determines whether the ground fault has occurred at the string STb or not, based on a difference between the current Ibp flowing at the positive electrode side of the string STb and the current Ibn flowing at the negative electrode side of the string STb.

If the fault detecting apparatus 1A specifies the string STa or STb at which the ground fault has occurred, the fault detecting apparatus 1A includes the specified string at which the ground fault (fault) has occurred in the fault detection signal Sng, as information, and outputs the signal to the host monitoring device 8.

According to the present embodiment, the ground fault at the PV array 2*a* or 2*b* can be detected based on the currents Iap and Ian detected by the current sensors 3*ap* and 3*an* provided on both the electrodes of all the n−1 strings except one string, the current Ibp detected by the current sensor 3*bp* provided on either electrode of the remaining string, and the current In detected by the current sensor 3*sn* provided on the wire Ln of the aggregated grounding electrode. If the strings are n-parallel, the number of the provided current sensors is 2n. In FIG. 2, the negative electrode side is the grounding electrode and the current sensor 3*sn* is used for the detection, but the current sensor 3*sp* is arranged instead of the current sensor 3*sn* to execute the detection in the configuration in which the positive electrode side is grounded.

In addition, the number of the current sensors can be reduced by allowing the current sensor 3*sp* provided on the aggregated wire Lp to serve as the current sensor to be used for the control of the inverter 5. The devices (for example, A/D converter) and wiring lines accompanying the current sensors can be thereby reduced.

Furthermore, the fault detecting apparatus 1A can measure the ground fault current Ig. Therefore, a current sensor configured to measure the ground fault current does not need to be provided on the ground line, etc. By measuring the ground fault current Ig, the fault detecting apparatus 1A can also allow a signal which stops the inverter 5 (gate block, etc.) to be output if, for example, the ground fault current is equal to or higher than a predetermined current value.

Third Embodiment

FIG. 3 is a diagram showing a configuration of a photovoltaic system 10B to which a fault detecting apparatus 1B of Third Embodiment is applied.

The photovoltaic system 10B in which two strings STc and STd are connected parallel to a PV array 2 will be mainly described, but any number that is equal to or greater than two, of strings may be connected parallel to the single PV array.

The photovoltaic system 10B comprises the fault detecting apparatus 1B, the PV array 2, three current sensors 3*cp*, 3*cn* and 3*sp*, a smoothing capacitor 4, an inverter 5, an interconnection transformer 6, and four circuit breakers 9*cp*, 9*cn*, 9*dp* and 9*dn*. The photovoltaic system 10B is connected to a power system 7. The smoothing capacitor 4, the inverter 5, the interconnection transformer 6 and the power system 7 are configured similarly to those of the First Embodiment. The PV array 2 is configured similarly to the PV arrays 2*a* and 2*b* of the First Embodiment.

The strings STc and STd are circuits which make connection between the PV array 2 and the inverter 5. The strings STc and STd include positive electrode wires STcp and STdp and negative electrode wires STcn and STdn, respectively. The positive electrode wires STcp and STdp and the negative electrode wires STcn and STdn, of the respective strings STc and STd, are connected to the PV array 2. All the strings STc and STd are connected to a set of wires Lp and Ln aggregated by parallel connection. The aggregated wires Lp and Ln are connected to a direct-current side of the inverter 5.

Every two of four circuit breakers 9*cp*, 9*cn*, 9*dp* and 9*dn* are provided on the positive electrode wires STcp and STdp and the negative electrode wires STcn and STdn that make connection between the PV array 2 and the inverter 5. By thus providing the plural circuit breakers 9*cp*, 9*cn*, 9*dp* and 9*dn* parallel on the positive electrode wires STcp and STdp and the negative electrode wires STcn and STdn, the capacities of the circuit breakers 9*cp*, 9*cn*, 9*dp* and 9*dn* can be made smaller and a circuit configuration equivalent to the circuit configuration provided with circuit breakers having a substantially large capacity can be obtained. The configuration using the circuit breakers will be described here, but the other devices may be used. For example, the reason for dividing the current path into a plurality of paths may be to reduce the capacity of a fuse. Alternatively, various devices are often provided, depending on an aspect of the photovoltaic system 10B. The configuration may be therefore implemented for the purpose of reducing the capacities of these devices.

The circuit breaker 9*cp* is provided on the positive electrode wire STcp of the string STc. The circuit breaker 9*cn* is provided on the negative electrode wire STcn of the string STc. The circuit breaker 9*dp* is provided on the positive electrode wire STdp of the string STd. The circuit breaker 9*dn* is provided on the negative electrode wire STdn of the string STd. The circuit breakers 9*cp*, 9*cn*, 9*dp* and 9*dn* disconnect and connect the wires STcp, STcn, STdp, and STdn in which the circuit breakers are provided, respectively.

The current sensor 3*cp* is provided to detect the current Icp flowing through the positive electrode wire STcp of the string STc. The current sensor 3*cp* outputs the detected current Icp to the fault detecting apparatus 1B. The current sensor 3*cn* is provided to detect the current Icn flowing through the negative electrode wire STcn of the string STc. The current sensor 3*cn* outputs the detected current Icn to the fault detecting apparatus 1B. The current sensor 3*sp* is provided on the aggregated positive electrode wire Lp, similarly to the First Embodiment, but may be provided on the negative electrode wire Ln.

In the fault detecting apparatus 1B, two current sensors 3*cp* and 3*cn* are provided for the string STc, of two strings STc and STd, to detect a fault. If the strings are n-parallel, the current sensors are provided at positive electrodes and negative electrodes of all n−1 strings except one string. The number of the current sensors provided at the strings is thus 2(n−1). If the current sensor 3*sp* provided on the aggregated positive electrode wire Lp is added to these current sensors, the number of the current sensors used in the fault detecting apparatus 1B is 2n−1.

The fault detecting apparatus 1B detects the fault at each of the strings STc and STd, based on the currents Icp, Icn and Ip detected by three current sensors 3*cp*, 3*cn* and 3*sp*. If the fault detecting apparatus 1B detects the fault, the fault detecting apparatus 1B outputs a fault detection signal Sng to notify occurrence of the fault to a host monitoring device 8.

Next, a method of detecting the fault by the fault detecting apparatus 1B will be described.

The fault detecting apparatus 1B computes the currents Idp and Idn flowing through the string STd at which no current sensor is provided, in the following equations, based on the currents Icp and Icn flowing through the string STc at which the current sensors 3*cp* and 3*cn* are provided and the current Ip flowing through the aggregated positive electrode wire Lp.

$$Idp = Ip - Icp \quad (3)$$

$$Idn = Ip - Icn \quad (4)$$

When the strings are n-parallel, the current flowing through the positive electrode wire of the string at which no current sensor is provided is computed by subtracting a sum of the currents flowing through the positive electrode wires of all the strings except the string at which no current sensor is provided, from the current flowing through the aggregated positive or negative electrode wire. Similarly, the current flowing through the negative electrode wire of the string at which no current sensor is provided is computed by subtracting a sum of the currents flowing through the negative electrode wires of all the strings except the string at which no current sensor is provided, from the current flowing through the aggregated positive or negative electrode wire.

The currents Icp, Icn, Idp and Idn flowing through the positive electrodes and the negative electrodes of all the strings STc and STd including the string STd at which no current sensor is provided are thus measured.

The fault detecting apparatus 1B determines whether an unbalance current flows to two strings STc and STd or not.

More specifically, the fault detecting apparatus 1B compares the currents Icp and Idp flowing through the positive electrodes of two strings STc and STd. If the fault detecting apparatus 1B determines that the current amounts differs (for example, if the difference between two currents Icp and Idp is equal to or greater than a preset current value) as a result of comparing two currents Icp and Idp, the fault detecting apparatus 1B determines that an unbalance current flows. Similarly, the fault detecting apparatus 1B compares the currents Icn and Idn flowing through the negative electrodes of two strings STc and STd, and determines whether an unbalance current flows or not. At the comparison between the currents of two strings STc and STd, currents different in polarity may be compared.

When the strings are n-parallel, the fault detecting apparatus 1B determines whether a string at which a smaller amount of current (or a greater amount of current) flows is present or not, as compared with a current flowing through the other string. If a string at which such a current flows is present, the fault detecting apparatus 1B determines an unbalance current flowing.

Next, a reason for determining occurrence of a fault when an unbalance current flows will be described.

Two strings STc and STd are circuits connected parallel between the common single PV array 2 and the direct-current side of the inverter 5. No load is connected to two strings STc and STd. In addition, the circuit breakers 9*cp*, 9*cn*, 9*dp* and 9*dn* are provided at the positive and negative electrode wires STcp, STcn, STdp, and STdn of two strings STc and STd, respectively. An impedance of each of the circuit breakers 9*cp*, 9*cn*, 9*dp* and 9*dn* is ideally zero if they are closed.

Based on these matters, the impedance of two strings STc and STd is substantially zero. Thus, the currents flowing through two strings STc and STd should be, theoretically, substantially the same as each other. When an unbalance current flows to two strings STc and STd, a fault that the impedance increases or the like is considered to occur at least one of the wires STcp, STcn, STdp, and STdn of the strings STc and STd.

Reasons for occurrence of the fault are considered to be looseness of bolts which connect the devices such as the circuit breakers 9cp, 9cn, 9dp and 9dn, fault at the devices such as the circuit breakers 9cp, 9cn, 9dp and 9dn, etc. besides the ground fault.

The fault detecting apparatus 1B can therefore detect the fault by detecting the flow of the unbalance current.

According to the present embodiment, the looseness of the bolts, the fault at the circuit breakers 9cp, 9cn, 9dp and 9dn, etc. can be detected, based on the currents Icp and Icn detected by the current sensors 3cp and 3cn each provided at both the electrodes of all the n−1 strings except one string, and the current Ip detected by the current sensor 3sp provided at the aggregated wire Lp. The number of the provided current sensors is thus 2n−1, at the n-parallel strings.

In addition, by allowing the current sensor 3sp provided at the aggregated wire Lp to serve as the current sensor to be used for the control of the inverter 5, the number of the current sensors can be further reduced.

Furthermore, by reducing the number of the current sensors 3cp, 3cn and 3sp to detect the fault, the devices (for example, A/D converter) and wiring lines accompanying the current sensors can also be reduced.

Fourth Embodiment

FIG. 4 is a diagram showing a configuration of a photovoltaic system 100 to which a fault detecting apparatus 10 of Fourth Embodiment is applied.

The photovoltaic system 100 in which two PV arrays 2a and 2b and two strings STa and STb are connected parallel will be mainly described, but any number that is equal to or greater than two, of PV arrays and strings may be provided.

In the photovoltaic system 100, the current sensor 3sp in the photovoltaic system 10 of the First Embodiment shown in FIG. 1 is replaced with the current sensor 3bp of the Second Embodiment, and the fault detecting apparatus 1 in the photovoltaic system 10 is replaced with the fault detecting apparatus 1C. The other portions are the same as those of the First Embodiment.

In the fault detecting apparatus 1C, single current sensor 3ap or 3bp is provided for each of two strings STa and STb to detect a fault. If the strings are n-parallel, the current sensors are provided at either positive electrodes or negative electrodes of all the strings. The number of the current sensors used in the fault detecting apparatus 1C is n.

The fault detecting apparatus 10 detects the fault at each of the strings STa and STb, based on the currents Iap and Ibp detected by two current sensors 3ap and 3bp. When the fault detecting apparatus 1C detects the fault, the fault detecting apparatus 10 outputs a fault detection signal Sng to notify occurrence of the fault to a host monitoring device 8.

Next, a method of detecting the fault by the fault detecting apparatus 10 will be described.

The fault detecting apparatus 1C determines directions of the currents Iap and Ibp flowing through the positive electrode side of all the strings STa and STb. If the fault detecting apparatus 10 determines that at least one of the directions of the currents Iap and Ibp flowing through the strings STa and STb is an opposite direction, the fault detecting apparatus 10 determines that the fault occurs at the strings STa and STb.

Next, a principle of detecting the fault will be described.

If the PV array 2b short-circuits at night and the PV array 2a normally starts generating the power in the daytime, the current Ibp flowing through the string STb flows in an opposite direction, as described in the First Embodiment. In addition, if the PV array 2a short-circuits at night and the PV array 2b normally starts generating the power in the daytime, the current Iap flowing through the string STa flows in an opposite direction.

In other words, if a circulating circuit flows between the strings STa and STb, the current flows in an opposite direction at either of the strings STa and STb. In a case where the strings are n-parallel, too, the current flows in an opposite direction at any one of the strings, similarly.

It can be therefore determined that a fault current flows, by detecting the current flowing through the opposite direction at either of the strings STa and STb.

According to the present embodiment, the fault that the PV arrays 2a and 2b short-circuit at night, which causes an overcurrent not to flow, can be detected, based on the currents Iap and Ibp detected by the current sensors 3ap and 3bp each provided at each of all the strings.

The configuration in which all the current sensors 3ap and 3bp are provided at the positive electrode wires STap and STbp has been described. However, the current sensors 3ap and 3bp may be provided at the negative electrode wires STan and STbn. In other words, if the current sensor is provided at each of all the strings, the fault can be detected. Thus, the number of the provided current sensors is n, for the n-parallel strings.

In addition, by reducing the number of the current sensors 3ap and 3bp configured to detect the fault, the devices (for example, A/D converter) and wiring lines accompanying the current sensors can be reduced.

In each of the embodiments, the fault detecting apparatuses 1-1C are provided outside the inverter 5, but may be implemented as a function of the inverter 5.

In addition, in each of the embodiments, the fault detecting apparatuses 1-1C are configured to output the fault detection signal Sng to the host monitoring device 8 if the fault is detected, but are not limited to this configuration. The fault detecting apparatuses 1-1C may output the fault detection signal Sng to the inverter 5 or may output the fault detection signal Sng to the other device. The fault detecting apparatuses 1-1C may output a signal for opening to the circuit breakers to protect the system, or may output the other protecting operation or an alarm, instead of the fault detection signal Sng.

Furthermore, each of the embodiments is configured to use the PV arrays 2, 2a or 2b, but may use the other power generator or a power supply such as a battery.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

The invention can provide a fault detecting apparatus capable of reducing the number of current sensors configured to detect a fault.

What is claimed is:

1. A fault detecting apparatus for detecting a fault in an electric circuit comprising a plurality of connecting circuits and an aggregating circuit, the plurality of connecting circuits comprising positive electrode wires and negative electrode wires connected parallel to respectively connect a plurality of DC power supplies with an inverter, and the aggregating circuit being configured to aggregate the plurality of connecting circuits and to connect the aggregated connecting circuits with the inverter, the apparatus comprising:

a plurality of connecting circuit current detectors configured to detect currents flowing through either the positive electrode wires or the negative electrode wires of all the connecting circuits except one connecting circuit, respectively;

an aggregating current detector configured to detect a current flowing after the connection circuits are aggregated by the aggregating circuit; and a fault detector configured to detect a fault when at least one of the connecting circuit current detectors detects that a current flows and if the aggregating current detector detects that a current does not flow.

2. An inverter apparatus comprising:

a fault detecting apparatus for detecting a fault in an electric circuit comprising a plurality of connecting circuits and an aggregating circuit, the plurality of connecting circuits comprising positive electrode wires and negative electrode wires connected parallel to respectively connect a plurality of DC power supplies with an inverter, and the aggregating circuit being configured to aggregate the plurality of connecting circuits and to connect the aggregated connecting circuits with the inverter, the fault detecting apparatus comprising:

a plurality of connecting circuit current detectors configured to detect currents flowing through either the positive electrode wires or the negative electrode wires of all the connecting circuits except one connecting circuit, respectively;

an aggregating current detector configured to detect a current flowing after the connection circuits are aggregated by the aggregating circuit; and a fault detector configured to detect a fault when at least one of the connecting circuit current detectors detects that a current flows and if the aggregating current detector detects that a current does not flow.

3. A fault detecting method for detecting a fault in an electric circuit comprising a plurality of connecting circuits and an aggregating circuit, the plurality of connecting circuits comprising positive electrode wires and negative electrode wires connected parallel to respectively connect a plurality of DC power supplies with an inverter, and the aggregating circuit being configured to aggregate the plurality of connecting circuits and to connect the aggregated connecting circuits with the inverter, the method comprising:

detecting currents flowing through either the positive electrode wires or the negative electrode wires of all the connecting circuits except one connecting circuit, respectively;

detecting a current flowing after the connecting circuits are aggregated by the aggregating circuit; and detecting a fault when it is detected that a current flows to at least one of the connecting circuits and if a current does not flow to the aggregating circuit.

* * * * *

UNITED STATES PATENT AND TRADEMARK OFFICE
CERTIFICATE OF CORRECTION

Page 1 of 1

PATENT NO.         : 9,863,992 B2
APPLICATION NO.    : 14/314069
DATED              : January 9, 2018
INVENTOR(S)        : Tatsuaki Ambo et al.

It is certified that error appears in the above-identified patent and that said Letters Patent is hereby corrected as shown below:

On the Title Page

Item (63), the Related U.S. Application Data is incorrect. Item (63) should read:
--Related U.S. Application Data
(63) Continuation of application No. PCT/JP2011/080072,
filed on Dec. 26, 2011.--

Signed and Sealed this
Twenty-fifth Day of June, 2019

Andrei Iancu
*Director of the United States Patent and Trademark Office*